US006586963B2

(12) United States Patent
Choi et al.

(10) Patent No.: US 6,586,963 B2
(45) Date of Patent: Jul. 1, 2003

(54) INTEGRATED CIRCUIT DEVICES HAVING POWER CONTROL LOGIC THAT INHIBITS INTERNAL LEAKAGE CURRENT LOSS DURING SLEEP MODE OPERATION AND METHOD OF OPERATING SAME

(75) Inventors: Hoon Choi, Seoul (KR); Jae-Young Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/037,290

(22) Filed: Jan. 3, 2002

(65) Prior Publication Data

US 2002/0135398 A1 Sep. 26, 2002

Related U.S. Application Data

(60) Provisional application No. 60/278,797, filed on Mar. 26, 2001.

(51) Int. Cl.[7] .............................................. H03K 17/16
(52) U.S. Cl. ......................................... 326/26; 326/38
(58) Field of Search ............................. 326/37, 38, 82, 326/26, 27

(56) References Cited

U.S. PATENT DOCUMENTS 5,666,355 A * 9/1997 Huah et al. ................. 370/311
6,021,500 A * 2/2000 Wang et al. ................. 713/320
6,064,223 A    5/2000 Lu et al.
6,081,135 A    6/2000 Goodnow et al.
6,144,251 A * 11/2000 Ogawa ......................... 327/544
6,426,908 B1 * 7/2002 Hidaka ......................... 365/222

* cited by examiner

Primary Examiner—Don Le
(74) Attorney, Agent, or Firm—Myers Bigel Sibley & Sajovec

(57) ABSTRACT

Integrated circuit devices utilizes on-chip power down control circuitry to control the timing of application of at least one external power signal to the device when a functional logic circuit within the device is switching in and out of an inactive mode of operation, such as a sleep mode. During a respective inactive mode, the leakage current characteristics of the respective functional logic circuit are improved by removal of the external power signal. The at least one external power signal may be provided by one or more power transistors operating in response to signals generated by external power transistor control circuitry. These power transistors may provide power to respective power supply pins that are coupled on-chip to the device and the external power transistor control circuitry may be responsive to one or more signals generated by the device.

29 Claims, 4 Drawing Sheets

INTEGRATED CIRCUIT DEVICES HAVING POWER CONTROL LOGIC THAT INHIBITS INTERNAL LEAKAGE CURRENT LOSS DURING SLEEP MODE OPERATION AND METHOD OF OPERATING SAME

REFERENCE TO PRIORITY APPLICATION

This application claims priority to U.S. Provisional Application Ser. No. 60/278,797, filed Mar. 26, 2001, the disclosure of which is hereby incorporated herein by reference.

FIELD OF THE INVENTION

The present invention relates to integrated circuit devices and, more particularly, to integrated circuit devices having functional logic circuits therein that can be selectively disposed in active and power saving sleep modes of operation.

BACKGROUND OF THE INVENTION

Integrated circuit devices that are fabricated using deep sub-micron (DSM) process technologies typically include MOS transistors having thinner gate oxides and lower threshold voltages (Vth). The use of DSM process technologies also typically increase device integration. Unfortunately, the achievement of higher integration levels and lower threshold voltages typically results in higher leakage currents because the magnitude of total leakage current is typically directly proportional to integration density and inversely proportional to threshold voltage. Thus, a simultaneous increase in integration density and decrease in threshold voltage can result in significant increases in leakage currents. One conventional technique for reducing total leakage current within an integrated circuit device is to provide MOS transistors having relatively high threshold voltages ("high-Vth") for some circuits within the device and MOS transistors having relatively low threshold voltages (low-Vth) for other circuits within the device. For example, high-Vth MOS transistors may be used for circuits that are not critical to timing and low-Vth MOS transistors, which typically have greater leakage, may be used for circuits that are critical for timing. Another conventional technique for reducing total leakage current includes use of a body voltage(s) on an integrated circuit chip as a way to increase effective threshold voltages for certain devices therein.

A technique for reducing leakage current is also described in U.S. Pat. No. 6,064,223 to Lu et al., entitled "Low Leakage Circuit Configuration for Mosfet Circuits." In this patent, at least one switchable pathway is provided between an active circuit and a power or ground node. This switchable pathway, which is provided by PMOS transistor 102 and/or NMOS transistor 108 in FIG. 2 of the '223 patent, is operable to reduce leakage current through the circuit by essentially disconnecting a power supply path from the circuit. One of many limitations with this technique is the requirement 120 that the switchable pathway be sufficiently large to provide a sufficiently low resistance path to the circuit when the circuit is operating in a high current active mode. However, the use of one or more large switchable pathways may, among other things, reduce integrated densities and complicate efficient layout of the circuit. U.S. Pat. No. 6,081,135 to Goodnow et al., entitled "Device and Method to Reduce Power Consumption in Integrated Semiconductor Devices," reduces power by eliminating unnecessary node toggling. Unneeded Node toggling is reduced by utilizing either a PMOS pull-up transistor or an NMOS pull-down transistor to pull the input of the circuit to a state that minimizes power consumption during periods in which a circuit is inactive. In an illustrated embodiment, the inputs to a circuit are all pulled high after a time of inactivity. This time of inactivity is proportional to the leakage current of the leakiest transistor in the circuit. By timing the input pulling proportional to the leakage current, the power consumption may be reduced without excessive power caused by the pulling itself. Unfortunately, this node toggling technique may reduce integration density by requiring significant on-chip timing and node pulling circuitry.

Thus, notwithstanding these conventional techniques to reduce leakage currents in highly integrated circuits, there continues to be a need for improved techniques that provide efficient current leakage control and do not require extensive on-chip circuitry.

SUMMARY OF THE INVENTION

An integrated circuit device according to one embodiment of the present invention utilizes on-chip power down control circuitry to control the timing of application of at least one external power signal to the device when a functional logic circuit within the device is switching in and out of an inactive mode of operation, such as a sleep mode. The at least one external power signal may be provided by one or more power transistors operating in response to signals generated by external power transistor control circuitry. These power transistors may provide power to respective power supply pins that are coupled on-chip to the device and the external power transistor control circuitry may be responsive to one or more signals generated by the device.

In particular, an integrated circuit device is preferably provided having at least one internal (e.g., on-chip) functional logic circuit therein. This internal functional logic circuit may be configurable in a respective active mode of operation or a power-saving sleep mode of operation. The internal functional logic circuit may also include an output at which a respective sleep mode request can be generated. In this case, the internal functional logic circuit may include circuitry that enables the functional logic circuit to generate its own sleep mode request. Functional logic circuits that are capable of generating their own sleep mode request include microprocessor, cache and LCD controller. According to other embodiments, a sleep mode request for a respective internal functional logic circuit may be generated external to the functional logic circuit. Such requests may be generated by other on-chip circuitry or circuitry located external to the device. The device is also preferably provided with an internal (i.e., on-chip) power control logic circuit that generates one or more power down signals. The power down signals may be provided to the external power transistor control circuitry and may be generated in direct response to the sleep mode request.

According to another embodiment of the present invention, an integrated circuit device comprises a plurality of internal functional logic circuits having respective active and power-saving sleep modes of operation. These internal functional logic circuits have first outputs at which respective sleep mode requests are generated. An internal power control logic circuit is also provided. This internal power control logic circuit generates respective power down signals in response to the sleep mode requests generated at the first outputs. These power down signals are provided external to the device. The device may also include a plurality of power supply pads that receive a respective plurality of external power supply signals, with each of the plurality of external power supply signals being provided to a respective one (or more) of the plurality of internal functional logic circuits. In particular, the power down signals generated by the internal power control logic circuit are preferably provided to external power switching circuitry that is electrically coupled to the plurality of power supply pads. The logic value of each of the power down signal can be used to influence whether the external power switching circuitry provides power to or withholds power from respective power supply pads.

According to a preferred aspect of this embodiment, the external power switching circuitry includes a power transistor control circuit that is responsive to the power down signals and a plurality of power transistors that are coupled to the power transistor control circuit and generate the external power supply signals. Moreover, the internal power control logic circuit may comprise an active mode restart control circuit having an output at which respective active restart signals are generated. Each of the plurality of internal functional logic circuits may be responsive to a respective active restart signal generated by the active mode restart control circuit. The logic value of the active restart signal can be used to control whether a respective functional logic circuit is switched from an active mode of operation to a sleep mode of operation and vice versa.

An additional embodiment of the present invention may include a system of integrated circuits. This system may include an integrated circuit chip and power switching circuitry that is located external to the integrated circuit chip. In this embodiment, a device on the chip preferably includes an internal functional logic circuit and an internal power control logic circuit. The internal functional logic circuit has two modes of operation. These two modes of operation include a normal active mode of operation and a power-saving sleep mode of operation, which can be initiated in response to a sleep mode request. The sleep mode request may be generated by the internal functional logic circuit or another circuit internal to the device. The sleep mode request may also be generated external to the device. The internal power control logic circuit performs operations to generate a power down signal in response to the sleep mode request. An active/sleep mode power supply pad is also preferably provided on the integrated circuit chip and this pad is preferably electrically coupled to the internal functional logic circuit. External power switching circuitry is also provided. The power switching circuitry selectively provides power to or withholds power from the active/sleep mode power supply pad in response to the power down signal generated by the internal power control logic circuit. The power switching circuitry may comprise a power transistor control circuit that is responsive to the power down signal and a power transistor that is electrically coupled to the power transistor control circuit and electrically coupled to the active/sleep mode power supply pad.

DESCRIPTION OF PREFERRED EMBODIMENTS

Figure 1:
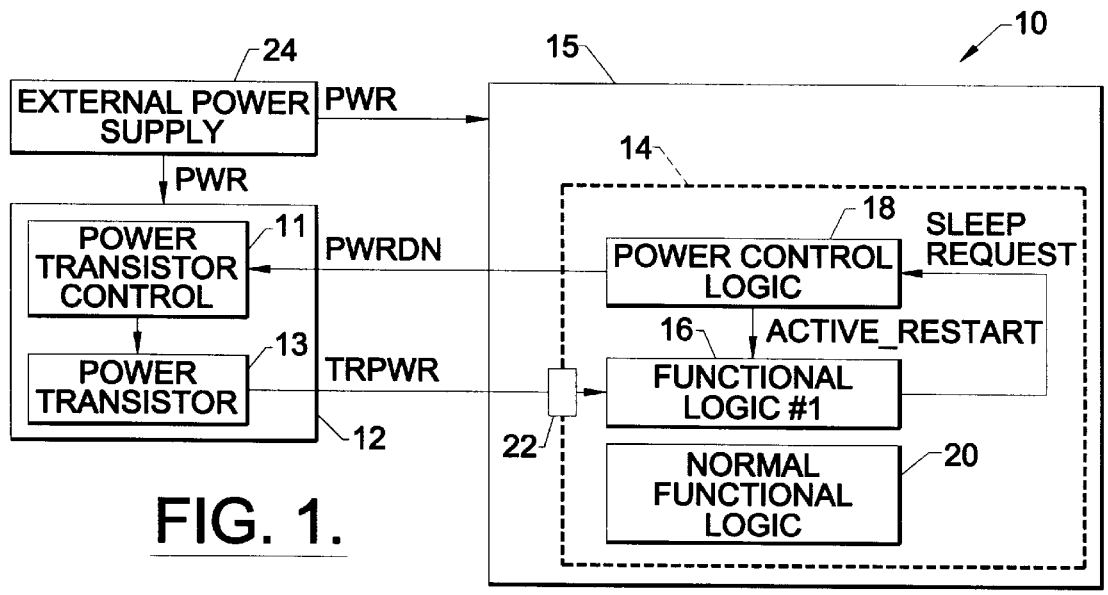
FIG. 1 is a block diagram of an integrated circuit device and associated external power switching circuitry according to a first embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Signal lines and signals thereon may be referred to by the same reference characters. Like numbers refer to like elements throughout.

Referring now to FIG. 1, an integrated circuit system 10 according to a first embodiment of the present invention includes an integrated circuit chip 15 and a power switching circuit 12 located external to the integrated circuit chip 15. As illustrated, an integrated circuit device 14 on the chip 15 preferably includes a first internal functional logic circuit 16 and an internal power control logic circuit 18. The first internal functional logic circuit 16 has two modes of operation. These two modes of operation include a normal "active" mode of operation and a power-saving "sleep" mode of operation which can be initiated in response to generation of a sleep mode request (SLEEP_REQUEST). The sleep mode request may be generated by the first internal functional logic circuit 16 or another circuit (not shown) that is located internal or external to the integrated circuit device 14 and/or chip 15. The integrated circuit device 14 may also include a normal internal functional logic circuit 20. Said normal internal functional logic circuit 20 may be operable in the normal "active" mode. Because this circuit 20 is not electrically connected to power switching circuit 20, so may not withhold power from that like the active/sleep mode power supply pad 22.

The internal power control logic circuit 18 preferably performs operations to generate a power down signal (PWRDN) and an active restart signal (ACTIVE_RESTART) in response to the sleep mode request. An active/sleep mode power supply pad 22 is also preferably provided on the integrated circuit chip 15 and this pad 22 is electrically coupled to the first internal functional logic circuit 16. For example, the active/sleep power supply pad 22 may be electrically connected to one or more power supply rails within the first internal functional logic circuit 16. The power switching circuit 12 selectively provides power to or withholds power from the active/sleep mode power supply pad 22 in response to the power down signal PWRDN generated by the internal power control logic circuit 18. The power switching circuit 12 may comprise a power transistor control circuit 11 that is responsive to the power down signal PWRDN and a power transistor 13 (or bank of power transistors) that is electrically coupled to the power transistor control circuit 11. The power transistor 13 provides the active/sleep mode power supply pad 22 with a switchable power signal (TRPWR). The integrated circuit system 10 may also include a external power supply device 24 that supplies a primary power signal (PWR) to the integrated circuit device 14 and to the power switching circuit 12.

Figure 2:
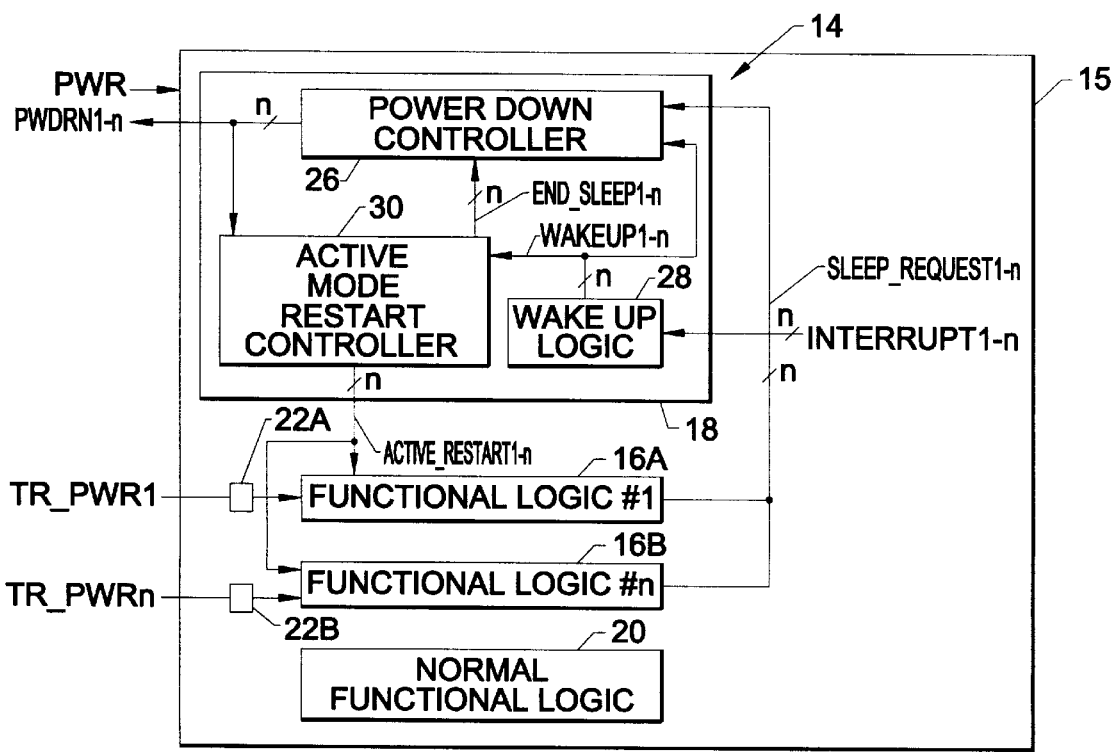
FIG. 2 is a block diagram of an integrated circuit device according to a second embodiment of the present invention.

Referring now to FIG. 2, a more detailed block diagram of a preferred integrated circuit device 14 is provided that includes an internal power control logic circuit 18 and a plurality of functional logic circuits. As illustrated, the plurality of functional logic circuits include a first functional logic circuit 16A and a second functional logic circuit 16B.

Both of these functional logic circuits 16A and 16B can be operated in respective active modes and inactive modes and both may include internal circuitry that can generate respective sleep mode requests (SLEEP_REQUEST1-$n$, where n is an integer). Exemplary functional logic devices include a memory devices, microprocessors and other devices that can be advantageously disposed in power saving sleep modes of operation. As explained more fully hereinbelow with respect to FIG. 3, the first and second functional logic circuits 16A–16B are responsive to respective switchable power signals TR_PWR1 and TR_PWRn. A normal functional logic circuit 20 may also be provided that does not have dual mode (active and sleep) capability. The internal power control logic circuit 18 is illustrated as comprising a power down controller 26, an active mode restart controller 30 and a wake-up logic circuit 28. The power down controller 26, which is responsive to the sleep mode request signals, generates a plurality of power down signals (PWRDN1-$n$). These power down signals are provided external to the integrated circuit device 14 and may also be provided to the active mode restart controller 30, as illustrated. The wake-up logic circuit 28 is responsive to one or more interrupt signals (INTERRUPT1-$n$) and generates one or more wakeup signals (WAKEUP1-$n$) in response thereto. The active mode restart controller 30 generates a plurality of end sleep signals (END_SLEEP1-$n$) and a plurality of active restart signals (ACTIVE_RESTART1-$n$) in response to the plurality of power down signals or the plurality of wakeup signals.

Operation of the device 14 of FIG. 2 will now be described with respect to the first functional logic circuit 16A. Similar operations are also performed with respect to the second functional logic circuit 16B. In particular, when the first functional logic circuit 16A is in a normal active mode of operation, the first active restart signal (ACTIVE_RESTART1) will be at an active level (e.g., logic 1 level) and the first switchable power signal (TR_PWR1) will be held at an appropriate power supply level. To initiate a sleep mode of operation, the first functional logic circuit 16A (or other internal or external device) may generate a sleep mode request (e.g., SLEEP_REQUEST1=1). In response to receipt of the sleep mode request, the power down controller 26 generates an active first power down signal (PWRDN1=1). This active first power down signal is preferably provided to external power switching circuitry, such as the power switching circuit 12 of FIG. 1, and to the active mode restart controller 30. In response, the active mode restart controller 30 switches the first active restart signal to an inactive level (e.g., shown as a logic 0 level). This switching of the active restart signal from active to inactive levels causes the first functional logic circuit 16A to switch into a sleep mode of operation. The first functional logic circuit 16A may respond synchronously to the switching of the active restart signal. Circuits internal to a functional logic circuit that enable switching from an active mode of operation to a power saving sleep mode of operation are well known to those skilled in the art and need not be described further herein. As described more fully hereinbelow with respect to FIGS. 3–4, the sleep mode of operation is preferably induced within the first functional logic circuit 16A at the time or before the first switchable power signal TR_PWR1 switches from a power supply level (e.g., Vdd) to an inactive level (e.g., GND).

The first functional logic circuit 16A may be maintained in a power saving sleep mode of operation for a predetermined period of time or a period of time having a length that is unspecified and contingent upon the occurrence of an event (e.g., timing, mode selection, etc.) internal or external to the integrated circuit device 14. For example, an interrupt signal (INTERRUPT1) may be generated as a logic 1 pulse to initiate conversion of the first functional logic device 16A from the inactive sleep mode to an active mode. As illustrated by FIG. 2, this interrupt signal may be received by a wake-up logic circuit 28 within the power control logic circuit 18. In response, the wake-up logic circuit 28 provides the active mode restart controller 30 and the power down controller 26 with a first wake-up signal (WAKEUP1). In response to the first wake-up signal, the power down controller 26 generates an inactive first power down signal (e.g., PWRDN1=0), which causes the external power switching circuit 12 to switch the first switchable power signal TR_PWR1 from an inactive level to an active level. Furthermore, after a sufficient time period has elapsed to achieve a stable first power supply signal TR_PWR1 to the first functional logic circuit 16A, the active mode restart controller 30 switches the first active restart signal from an inactive level to an active level that terminates the sleep mode of operation within the first functional logic circuit 16A. The respective functional logic circuit may then resume a normal active mode of operation.

Figure 3:
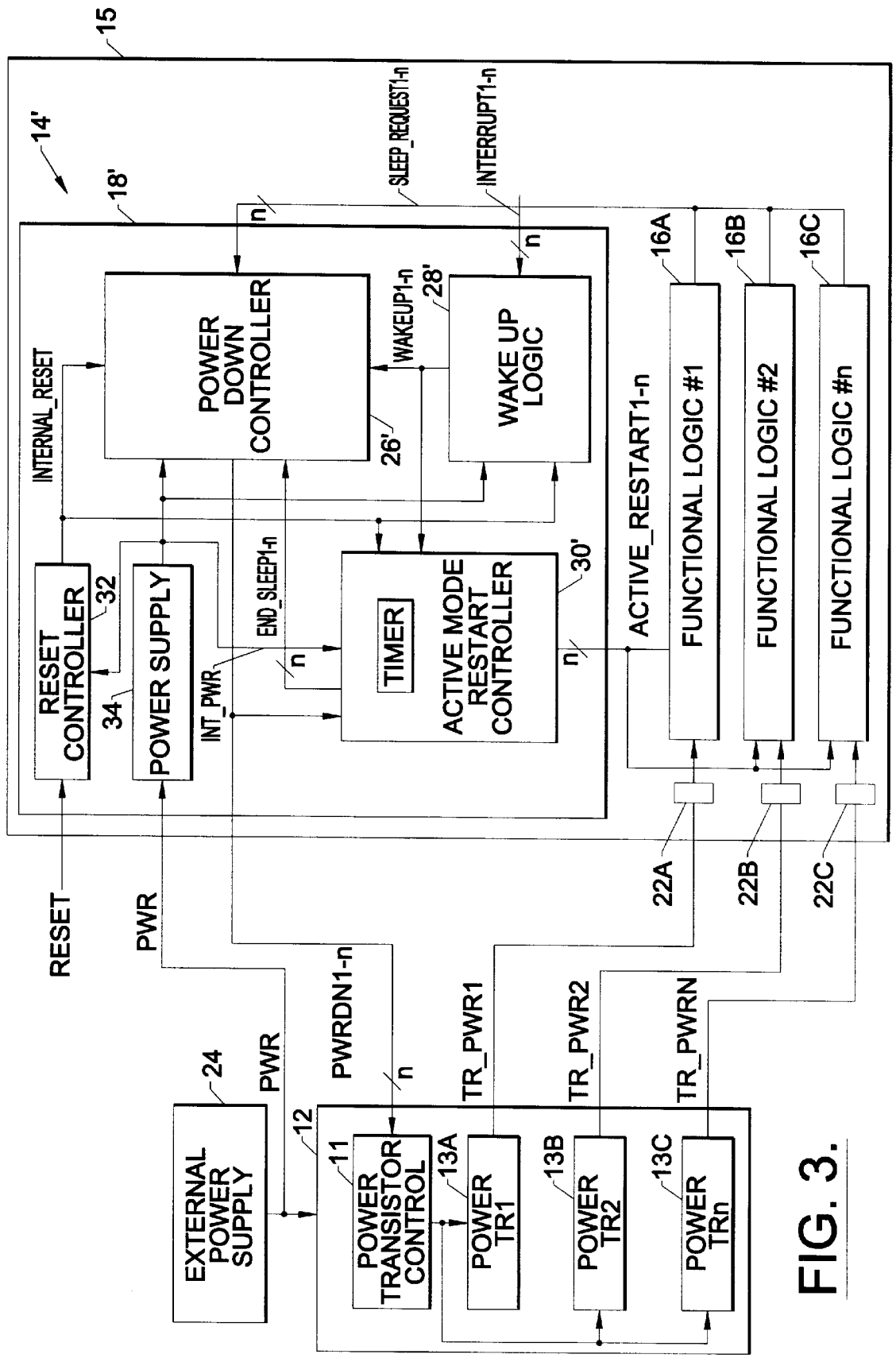
FIG. 3 is a block diagram of an integrated circuit device according to a third embodiment of the present invention.
Figure 4:
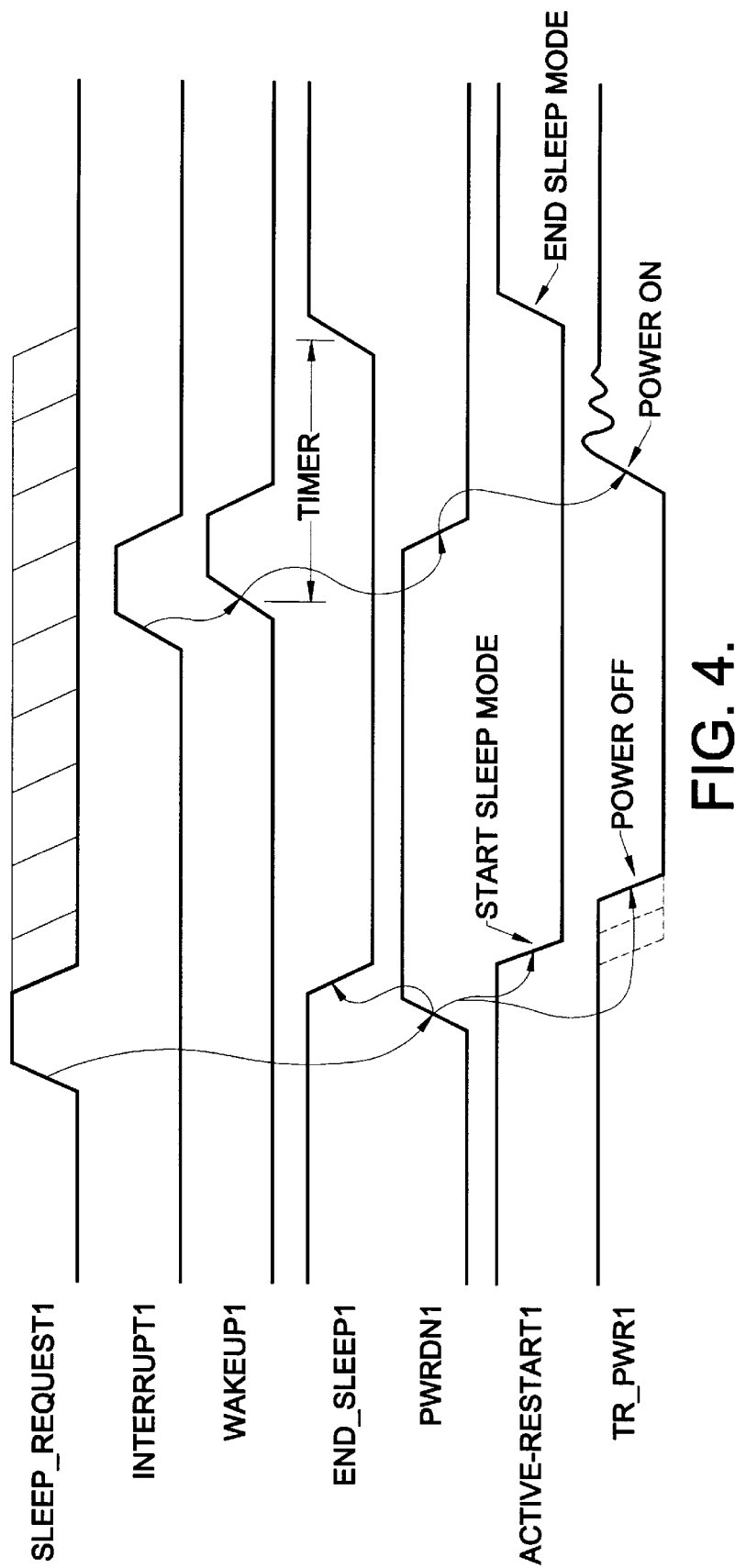
FIG. 4 is a timing diagram that illustrates operation of the integrated circuit devices of FIGS. 1–3.

Referring now to FIGS. 3–4, an integrated circuit device 14' according to another embodiment of the present invention will be described. As illustrated, the integrated circuit device 14', which is preferably arranged on a single integrated circuit chip 15, includes a power control logic circuit 18'. The power control logic circuit 18' is illustrated as including a power down controller 26', an active mode restart controller 30' and a wake-up logic circuit 28'. The wake-up logic circuit 28' generates one or more wake-up signals (WAKEUP1-$n$) in response to respective interrupt signals (INTERRUPT1-$n$). These interrupt signals may be generated internal or external to the integrated circuit chip 15. The wake-up logic circuit 28' may be responsive to an internal power supply signal and an internal reset signal (INTERNAL_RESET). As illustrated, a reset controller 32 may generate the internal reset signal in response to an external reset signal (RESET). This reset controller 32 may be of conventional design and need not be described further herein. The internal power supply signal may be generated by a power supply 34, using conventional techniques. The power supply 34 may be located inside of the chip 15 or outside of the chip 15. The power supply 34 may be supplied primary power from the external power supply 24, change the primary power into a different voltage level which is appropriate for the integrated circuit device 14'.

Each of the functional logic circuits 16A, 16B and 16C are illustrated as generating respective sleep mode requests (SLEEP_REQUEST1-$n$), however, one or more of these sleep mode request may be generated by other circuitry located internal to or external to the integrated circuit device 14'. The active restart signals (ACTIVE_RESTART1-$n$) are generated by the active mode restart controller 30', which preferably includes a built-in timer. The active mode restart controller 30' may generate the active restart signals in response to the plurality of power down signals PWRDN1-$n$ generated by the power down controller 26'. The power down controller 26' may also receive a plurality of end sleep signals (END_SLEEP1-$n$) from the active mode restart controller 30'. The power down controller 26' may utilize the end sleep signals to mask respective ones of the sleep request signal lines once a respective sleep mode request has been entered.

Not to be interrupted by a subsequent sleep request if the respective functional logic circuit is already in a respective sleep mode, the subsequent sleep request is masked by END_SLEEP. A masking function block(not shown) may be in power down controller 26'. One example is use of an AND gate. SLEEP_REQUEST and END_SLEEP may be inputs of the AND gate. SLEEP_REQUEST is low and END_SLEEP is high during an normal active mode. However when SLEEP_REQUEST1 is triggered to high for respective functional logic circuit, the output of the AND gate may be high. END_SLEEP1 is low state, so the subsequent sleep request is masked by END_SLEEP during the respective functional logic circuit is in a respective sleep mode. After END_SLEEP is triggered to high, the subsequent sleep request can be processed.

The power switching circuit 12 located external to the integrated circuit chip 15 receives power from the external power supply 24, as illustrated. The power switching circuit 12 preferably includes a power transistor control circuit 11 that receives the plurality of power down signals from the integrated circuit device 14'. These power down signals PWRDN1-*n* may constitute active high signals. Accordingly, in response to a rising transition of a first power down signal PWRDN1, the power transistor control circuit 11 may generate a control signal that switches a first power transistor 13A off, thereby withholding power from a first active/sleep mode power supply pin 22A. The power transistor control circuit 11 controls the second and n'th power transistors 13B and 13C and possibly others (not shown) in a similar manner. Thus, a rising transition of a second power down signal PWRDN2 will result in the withholding power from the second active/sleep mode power supply pin 22B and a rising transition of the n'th power down signal PWRDNn will result in a withholding of power from the n'th active/sleep mode power supply pin 22C.

Referring now to the timing diagram of FIG. 4, the generation of an active high first sleep request SLEEP_REQUEST1 by the first functional logic circuit 16A (or other circuit) will cause the power down controller 26' to generate an active high first power down signal PWRDN1, as illustrated. In response to the active high first power down signal PWRDN1, the active mode restart controller 30' will switch the first active restart signal ACTIVE_RESTART1 from high to low in order to induce a sleep mode of operation within the first functional logic circuit 16A. In response to the active high first power down signal PWRDN1, the power switching circuit 12 will withhold power from the first active/sleep mode power supply pin 22A by switching power signal TR_PWR1 from high to low. According to a preferred aspect of this embodiment of the present invention, switching power signal TR_PWR1 from high to low occurs at the time or after the first functional logic circuit 16A has already entered (or commenced entering) its respective sleep mode of operation.

Referring still to FIG. 4, the receipt of a leading edge of an active high first interrupt signal INTERRUPT1 will trigger the wake-up logic circuit 28' to generate a first wake-up signal WAKEUP1. In response, the power down controller 26' resets the first power down signal PWRDN1 from high to low. This high to low transition of the first power down signal PWRDN1 will cause the power transistor control circuit 11 to enable the first power transistor TR1. In response, power signal TR_PWR1 will be switched from low to high. As illustrated, a settling time may be necessary before the power signal TR_PWR1 reaches a steady level. The active mode restart controller 30' also preferably operates to start an internal timer upon detecting a rising edge of the first wake-up signal WAKEUP1. Alternatively, the active mode restart controller 30' may operate to start the internal timer upon detecting a falling edge of the first power down signal PWRDN1. Once the internal timer has timed out, the first active restart signal ACTIVE_RESTART1 will switch from low to high in order to switch the first functional logic circuit 16A from its sleep mode to an active mode. The first end sleep signal END_SLEEP1 will also switch from low to high to terminate the masking period within the power down controller 26'. To avoid erroneous operation of the first functional logic circuit 16A, it is preferred that the time out period associated with the timer be sufficiently long so that the switching of the first functional logic circuit 16A from its sleep mode to an active mode does not occur until after the power signal TR_PWR1 has reached a steady-state condition.

Figure 5:
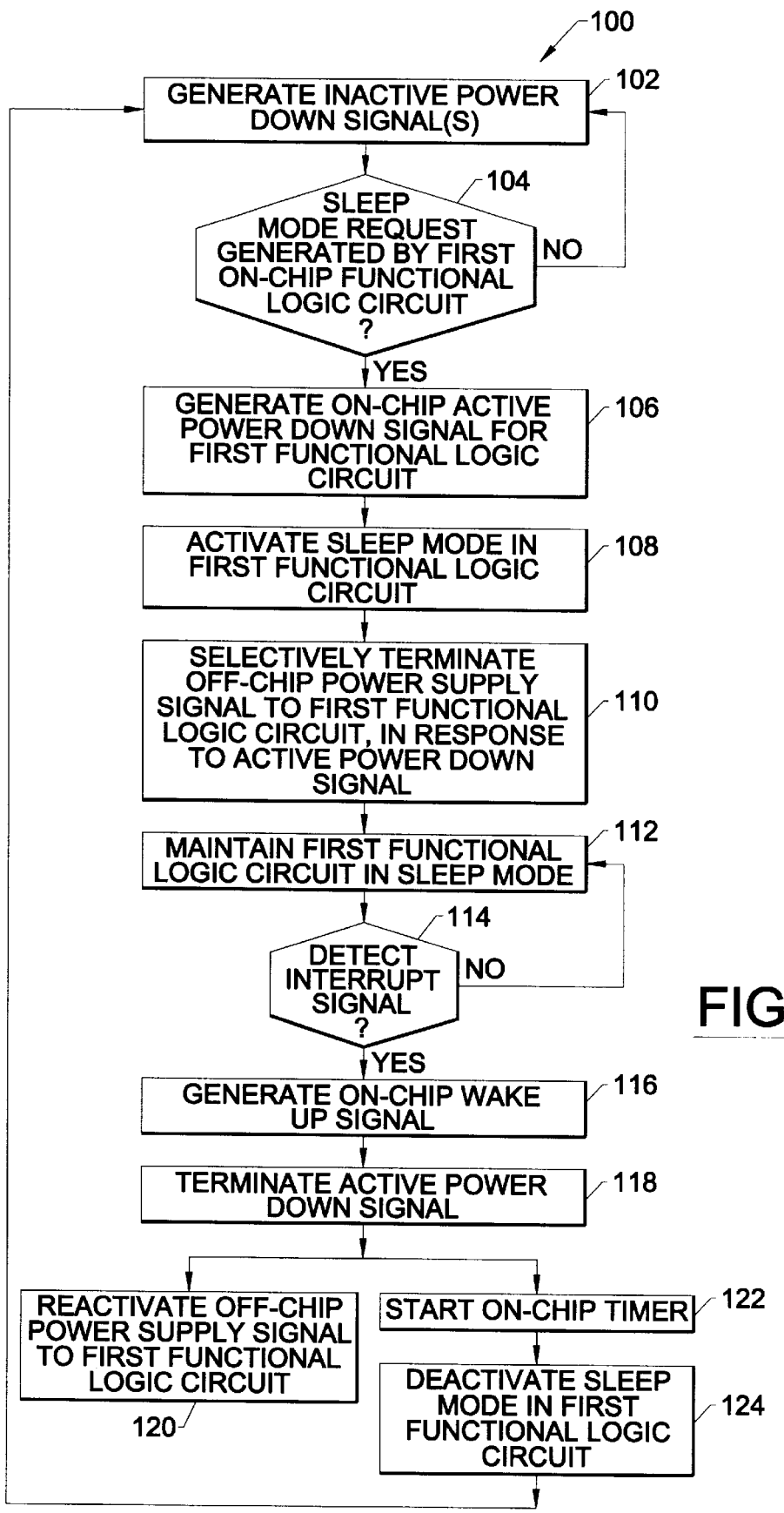
FIG. 5 is flow diagram that illustrates operations performed by the integrated circuit devices of FIGS. 1–3.

Referring now to the flow diagram of FIG. 5, operations 100 performed by integrated circuit embodiments of the present invention will be described. It should also be noted that in some alternative implementations, the operations noted in the blocks may occur out of the order noted in the flowchart. For example, two blocks shown in succession may in fact be executed substantially concurrently or the blocks may sometimes be executed in the reverse order, depending upon the operations involved. As illustrated by Block 102, inactive power down signals PWRDN1-*n* are typically generated when functional logic circuits within an integrated circuit are operating in respective active modes. However, upon detection of a sleep mode request 104 by a first on-chip functional logic circuit (or other circuit), Block 104, a respective active power down signal is generated, Block 106. In addition, the first functional logic circuit is switched into a sleep mode of operation, Block 108, and then an off-chip power supply signal is withheld from the first functional logic circuit, Block 110. As described above, this withholding of an off-chip power supply signal improves the leakage current characteristics of the first functional logic circuit when operating in a respective sleep mode. This sleep mode of operation is then maintained, Block 112, until an interrupt signal is generated within the device (or received from external the device) and detected, Block 114. In response, an active wake up signal (e.g., logic 1 pulse) is generated to commence resumption of an active mode within the first functional logic circuit, Block 116. Upon detection of the wake up signal, the active power down signal is switched to an inactive level, Block 118, and the off-chip power supply signal is reactivated, Block 120. An on-chip timer is also preferably started, Block 122. After the timer times out, the first functional logic circuit is switched form its sleep mode to an active mode, Block 124, and control is returned to Block 102 until another sleep mode request is detected.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a plurality of internal functional logic circuits having respective active and power-saving sleep modes of operation, said internal functional logic circuits having respective first outputs at which respective sleep mode requests are generated; and
   an internal power control logic circuit that generates respective power down signals in response to the sleep mode requests generated at the first outputs, said plurality of power down signals provided external to the device in order to control supplying power to or withholding power from respective internal functional logic circuit of the device during respective active and sleep modes of operation.

2. An integrated circuit device, comprising:
a plurality of internal functional logic circuits having respective active and power-saving sleep modes of operation, said internal functional logic circuits having respective first outputs at which respective sleep mode requests are generated; and
an internal power control logic circuit having an active mode of operation but no power-saving sleep mode of operation, said internal power control logic circuit configured to generate respective power down signals in response to the sleep mode requests generated at the first outputs, said plurality of power down signals provided external to the integrated circuit device in order to control supplying power to or withholding power from respective internal functional logic circuits of the device during respective active and sleep modes of operation.

3. The integrated circuit device of claim 2, wherein the device has a plurality of power supply pads that receive a respective plurality of external power supply signals; and
wherein each of the plurality of external power supply signals is provided to a respective one of said plurality of internal functional logic circuits.

4. The integrated circuit device of claim 3, wherein the power down signals generated by said internal power control logic circuit are provided to external power switching circuitry that is electrically coupled to the plurality of power supply pads; and
wherein a value of each of the power down signals influences whether the external power switching circuitry provides power to or withholds power from respective one of the plurality of power supply pads.

5. The integrated circuit device of claim 4, wherein said external power switching circuitry comprises:
a power transistor control circuit that is responsive to the power down signals; and
a plurality of power transistors that are coupled to said power transistor control circuit and generate the external power supply signals.

6. The integrated circuit device of claim 2, wherein said internal power control logic circuit comprises an active mode restart control circuit having an output at which respective active restart signals are generated.

7. The integrated circuit device of claim 6, wherein each of said plurality of internal functional logic circuits is responsive to a respective active restart signal generated by said active mode restart control circuit.

8. An integrated circuit system, comprising:
an integrated circuit chip;
an internal functional logic circuit on said integrated circuit chip, said internal functional logic circuit having an active mode of operation and a power-saving sleep mode of operation which is initiated by the generation of a sleep mode request on or off said integrated circuit chip;
an internal power control logic circuit on said integrated circuit chip that generates a power down signal in response to the sleep mode request;
an active/sleep mode power supply pad that extends on said integrated circuit chip and is electrically coupled to said internal functional logic circuit; and
power switching circuitry that is disposed external to said integrated circuit chip, is electrically connected to said active/sleep mode power supply pad and supplies power to or withholds power from said active/sleep mode power supply pad in response to the power down signal generated by said internal power control logic circuit.

9. The system of claim 8, wherein said internal power control logic circuit has an active mode of operation but no power-saving sleep mode of operation.

10. The system of claim 9, wherein said power switching circuitry comprises:
a power transistor control circuit that is responsive to the power down signal; and
a power transistor that is electrically coupled to said power transistor control circuit and to said active/sleep mode power supply pad.

11. The system of claim 9, wherein said internal power control logic circuit comprises an active mode restart control circuit having an output at which an active mode restart signal is generated.

12. The system of claim 11, wherein said active mode restart control circuit generates an end-sleep control signal; and
wherein said internal power control logic circuit comprises a power down control circuit that is responsive to the end-sleep control signal.

13. The system of claim 12, wherein said power down control circuit comprises a masking circuit having inputs that receive said end-sleep control signal and the sleep mode request.

14. The system of claim 13, wherein said internal power control logic circuit comprises a wake-up logic circuit that generates a wake-up signal in response to an interrupt signal; and
wherein said active mode restart control circuit comprises a timer that times generation of the end-sleep control signal relative to the wake-up signal.

15. The system of claim 14, wherein said power down control circuit resets the power down signal in response to the wake-up signal.

16. The system of claim 15, wherein said power switching circuitry switches from a mode during which power was withheld from said active/sleep mode power supply pad to a mode that supplies power to said active/sleep mode power supply pad in-sync with the reset of the power down signal.

17. An integrated circuit device, comprising:
an internal functional logic circuit having an active mode of operation and a power-saving sleep mode of operation, said internal functional logic circuit having an output at which a sleep mode request is generated; and
an internal power control logic circuit that generates a power down signal in response to the sleep mode request generated at the output, said power down signal provided external to the device in order to control supplying power to or withholding power from the internal functional logic circuit of the device during the active or sleep mode of operation.

18. A method of operating an integrated circuit device, comprising the steps of:
operating first and second functional logic circuits internal to the integrated circuit device in respective power supplying modes during which power switching circuitry external to the integrated circuit device selectively supplies power to each of the first and second functional logic circuits;

generating an active first sleep mode request signal internal to or external to the integrated circuit device;

transferring an active first power down signal from the integrated circuit device to the power switching circuitry, in response to the active first sleep mode request signal; and switching the external power switching circuitry from a first power supplying mode to a first power withholding mode during which power is selectively withheld from the first functional logic circuit but not the second functional logic circuit, in response to the active first power down signal.

19. The method of claim 18, further comprising the step of generating an interrupt signal internal to or external to the integrated circuit device; and wherein said transferring step comprises generating a trailing edge of the first power down signal in-sync with a leading edge of the interrupt signal.

20. The method of claim 19, wherein said switching step comprises switching the external power switching circuitry from the first power withholding mode back to the first power supplying mode, in-sync with the trailing edge of the first power down signal.

21. A method of operating an integrated circuit device, comprising the steps of:

operating first and second functional logic circuits internal to the integrated circuit device in respective power supplying modes during which power switching circuitry external to the integrated circuit device selectively supplies power to each of the first and second functional logic circuits;

generating an active first sleep mode request signal internal to or external to the integrated circuit device;

transferring an active first power down signal from the integrated circuit device to the power switching circuitry, in response to the active first sleep mode request signal; and switching the external power switching circuitry from a first power supplying mode to a first power withholding mode during which power is selectively withheld from the first functional logic circuit but not the second functional logic circuit, in response to the active first power down signal;

wherein said transferring step comprises generating a leading edge of the first power down signal in-sync with a leading edge of the first sleep mode request signal.

22. A method of operating an integrated circuit device, comprising the steps of:

operating a first logic circuit internal to the integrated circuit device in an power saving mode during which power switching circuitry external to the integrated circuit device selectively supplies power to the first functional logic circuit;

generating an active first sleep mode request signal internal to or external to the integrated circuit device;

transferring an active first power down signal from the integrated circuit device to the power switching circuitry, in response to the active first sleep mode request signal; and switching the external power switching circuitry from a first power supplying mode to a first power withholding mode during which power is selectively withheld from the first functional logic circuit, in response to the active first power down signal.

23. The method of claim 22, wherein said transferring step comprises generating a leading edge of the first power down signal in-sync with a leading edge of the first sleep mode request signal.

24. The method of claim 22, further comprising the step of generating an interrupt signal internal to or external to the integrated circuit device; and wherein said transferring step comprises generating a trailing edge of the first power down signal in-sync with a leading edge of the interrupt signal.

25. The method of claim 24, wherein said switching step comprises switching the external power switching circuitry from the first power withholding mode back to the first power supplying mode, in-sync with the trailing edge of the first power down signal.

26. An integrated circuit device, comprising:

a plurality of internal functional logic circuits having respective active and power-saving sleep modes of operation, said internal functional logic circuits having respective first outputs at which respective sleep mode requests are generated; and an internal power control logic circuit that generates respective power down signals that are provided external to the device, in response to the sleep mode requests generated at the first outputs.

27. The integrated circuit device of claim 26, wherein the device has a plurality of power supply pads that receive a respective plurality of external power supply signals; and wherein each of the plurality of external power supply signals is provided to a respective one of said plurality of internal functional logic circuits.

28. The integrated circuit device of claim 27, wherein the power down signals generated by said internal power control logic circuit are provided to external power switching circuitry that is electrically coupled to the plurality of power supply pads; and wherein a value of each of the power down signals influences whether the external power switching circuitry provides power to or withholds power from respective one of the plurality of power supply pads.

29. An integrated circuit device, comprising:

a plurality of internal functional logic circuits having respective active and power-saving sleep modes of operation, said internal functional logic circuits having respective first outputs at which respective sleep mode requests are generated; and an internal power control logic circuit that generates respective power down signals that are provided external to the device, in response to the sleep mode requests generated at the first outputs, said internal power control logic having an active mode of operation but no power-saving sleep mode of operation.

* * * * *